United States Patent
Cook et al.

(10) Patent No.: US 8,691,393 B2
(45) Date of Patent: Apr. 8, 2014

(54) EMI SHIELDING HEAT SHRINKABLE TAPES

(71) Applicants: Kelly G. Cook, St. Louis, MO (US); Larry D. Creasy, Jr., St. Clair, MO (US)

(72) Inventors: Kelly G. Cook, St. Louis, MO (US); Larry D. Creasy, Jr., St. Clair, MO (US)

(73) Assignee: Laird Technologies, Inc., Earth City, MO (US)

(*) Notice: Subject to any disclaimer, the term of this patent is extended or adjusted under 35 U.S.C. 154(b) by 0 days.

(21) Appl. No.: 13/747,086

(22) Filed: Jan. 22, 2013

(65) Prior Publication Data

US 2013/0133941 A1   May 30, 2013

Related U.S. Application Data

(63) Continuation of application No. PCT/US2010/054251, filed on Oct. 27, 2010.

(51) Int. Cl.
| | | |
|---|---|---|
| *H01R 13/658* | (2011.01) | |
| *B32B 15/08* | (2006.01) | |
| *B32B 15/082* | (2006.01) | |
| *B32B 15/085* | (2006.01) | |
| *B32B 15/09* | (2006.01) | |
| *B32B 15/095* | (2006.01) | |
| *B32B 15/14* | (2006.01) | |
| *B32B 27/08* | (2006.01) | |
| *B32B 27/12* | (2006.01) | |
| *B32B 27/30* | (2006.01) | |
| *B32B 27/32* | (2006.01) | |
| *B32B 27/36* | (2006.01) | |

(52) U.S. Cl.
USPC .......... 428/458; 428/34.9; 428/457; 428/461; 428/462; 428/463; 428/480; 428/483; 428/423.1; 428/423.7; 428/424.2; 428/424.8; 428/515; 428/516; 428/517; 428/519; 428/520; 428/521; 428/522; 428/523; 174/102 R; 174/107; 174/32; 174/350

(58) Field of Classification Search
None
See application file for complete search history.

(56) References Cited

U.S. PATENT DOCUMENTS

| | | | | |
|---|---|---|---|---|
| 3,086,242 | A | * | 4/1963 | Cook et al. ............... 264/566 |
| 4,542,076 | A | * | 9/1985 | Bednarz et al. ........... 428/624 |
| 4,814,546 | A | * | 3/1989 | Whitney et al. ........... 174/36 |
| 4,874,665 | A | * | 10/1989 | Doheny ................... 428/345 |

(Continued)

FOREIGN PATENT DOCUMENTS

| | | |
|---|---|---|
| EP | 0352729 | 1/1990 |
| KR | 10-0749565 | 8/2007 |
| WO | WO 03/013208 | 2/2003 |
| WO | WO 2012/057746 | 5/2012 |

OTHER PUBLICATIONS

International Search Report and Written Opinion from PCT International Application No. PCT/US2010/054251 (now published as WO 2012/057746) dated Jul. 28, 2011; 9 pages. The instant application is a continuation of PCT/US2010/054251.

*Primary Examiner* — Vivian Chen
(74) *Attorney, Agent, or Firm* — Harness, Dickey & Pierce, P.L.C.

(57) ABSTRACT

Disclosed herein are various exemplary embodiments of electromagnetic interference (EMI) shielding heat shrinkable materials and articles (e.g., tapes, etc.). In an exemplary embodiment, an EMI shielding heat shrinkable tape includes a heat shrinkable layer and an EMI shielding layer. When heated to a shrink temperature of the heat shrinkable layer, the tape may shrink lengthwise.

21 Claims, 4 Drawing Sheets

(56) References Cited

U.S. PATENT DOCUMENTS

| | | | |
|---|---|---|---|
| 4,980,223 A * | 12/1990 | Nakano et al. | 428/198 |
| 5,063,005 A * | 11/1991 | Doheny, Jr. | 264/471 |
| 5,177,143 A * | 1/1993 | Chang et al. | 524/848 |
| 6,005,191 A * | 12/1999 | Tzeng et al. | 174/102 R |
| 6,818,291 B2 * | 11/2004 | Funkenbusch et al. | 428/336 |
| 6,881,904 B2 * | 4/2005 | Millas et al. | 174/124 R |
| 8,014,763 B2 * | 9/2011 | Hymes | 455/414.2 |
| 2002/0037376 A1 * | 3/2002 | Fenton | 428/34.9 |
| 2002/0037657 A1 | 3/2002 | Hirai et al. | |
| 2002/0378376 | 3/2002 | Fenton | |
| 2003/0183326 A1 * | 10/2003 | O'Connor | 156/187 |

\* cited by examiner

EMI SHIELDING HEAT SHRINKABLE TAPES

CROSS-REFERENCE TO RELATED APPLICATION

This application is a continuation of PCT International Application No. PCT/US2010/054251, filed Oct. 27, 2010 (Published as WO 2012/057746 on May 3, 2012). The entire disclosure of the above application is incorporated herein by reference in its entirety.

FIELD

The present disclosure relates to electromagnetic interference (EMI) shielding heat shrinkable tapes.

BACKGROUND

This section provides background information related to the present disclosure which is not necessarily prior art.

The operation of electronic devices generates electromagnetic radiation within the electronic circuitry of the equipment. Such radiation results in electromagnetic interference (EMI) or radio frequency interference (RFI), which can interfere with the operation of other electronic devices within a certain proximity. Without adequate shielding, EMI/RFI may cause degradation or complete loss of important signals, thereby rendering the electronic equipment inefficient or inoperable. A common solution to ameliorate the effects of EMI/RFI is through the use of shields capable of absorbing and/or reflecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) generally includes and refers to EMI shielding and RFI shielding, for example, to prevent (or at least reduce) ingress and egress of EMI and RFI relative to wiring, cabling, or an enclosure in which electronic equipment is disposed.

SUMMARY

This section provides a general summary of the disclosure, and is not a comprehensive disclosure of its full scope or all of its features.

Disclosed herein are various exemplary embodiments of electromagnetic interference (EMI) shielding heat shrinkable materials and articles (e.g., tapes, etc.). In an exemplary embodiment, an EMI shielding heat shrinkable tape includes a heat shrinkable layer and an EMI shielding layer. When heated to a shrink temperature of the heat shrinkable layer, the tape may shrink lengthwise.

In another exemplary embodiment, an EMI shielding heat shrinkable article includes a heat shrinkable layer that includes polyolefin. An EMI shielding layer is bonded to the heat shrinkable layer. The EMI shielding layer includes a polyethylene terephthalate (PET) film having electrically-conductive material thereon.

Also disclosed herein are various methods of making EMI shielding materials and articles (e.g., tapes, etc.). For example, there is disclosed herein a method for making an EMI shielding heat shrinkable tape that shrinks lengthwise but not widthwise when heated to a shrink temperature. This method includes bonding or coating a heat shrinkable layer with an EMI shielding layer.

Another exemplary embodiment includes a method for making EMI shielding heat shrinkable articles. This method includes bonding a heat shrinkable layer including polyolefin to an EMI shielding layer. The EMI shielding layer includes a polyethylene terephthalate (PET) film having electrically-conductive material thereon.

Methods for providing EMI shielding to objects (e.g., cables, etc.) are also disclosed herein. One such method includes wrapping an EMI shielding heat shrinkable tape about an object such that an EMI shielding layer of the tape is adjacent the object and a heat shrinkable layer of the tape is positioned outwardly relative to the EMI shielding layer. The method may further include heat shrinking the tape in the lengthwise direction so that the tape constricts around the object.

In another exemplary embodiment, a method includes wrapping an EMI shielding heat shrinkable article about an object such that an EMI shielding layer of the article is adjacent the object and a heat shrinkable layer of the article is positioned outwardly relative to the EMI shielding layer. The heat shrinkable article includes polyolefin. The EMI shielding layer includes a polyethylene terephthalate (PET) film having electrically-conductive material thereon. This method may further include heat shrinking the article.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

The following description is merely exemplary in nature and is in no way intended to limit the present disclosure, application, or uses.

The inventors disclose herein electromagnetic interference (EMI) shielding heat shrinkable materials and articles (e.g., tapes, etc.) that include a heat shrinkable layer and an EMI shielding layer according to one or more aspects of the present disclosure. The disclosed EMI shielding heat shrinkable materials and articles may be used in a wide range of applications, installations, and electronic equipment. For example, EMI shielding heat shrinkable tapes are disclosed herein, which include a heat shrinkable layer coated with or bonded to an EMI shielding layer and which may be wrapped about a cable, cabling, or wiring to provide EMI shielding.

As disclosed herein, some exemplary embodiments of EMI shielding heat shrinkable articles and materials may include a polyolefin heat shrinkable layer bonded to an EMI shielding layer. The EMI shielding layer may include polyethylene terephthalate (PET) film having electrically conductive material thereon (e.g., vapor deposited metal, metal foil laminated thereto, etc.). The inventors hereof have recognized that PET film with metal (e.g., PET film/aluminum foil laminate, etc.) is less costly than the electrically-conductive foils or fabric tapes used in some EMI shielding products for cables. Additionally, the inventors have recognized that the use of polyolefin for the heat shrinkable layer in exemplary embodiments disclosed herein can provide sufficient and/or more protection to a cable, etc. being shielded than just fabric or foil tapes alone. Moreover, the disclosed embodiments of EMI shielding heat shrinkable articles and materials may be installed without having to remove connectors.

Alternative embodiments include other suitable materials besides polyolefin for the heat shrinkable layer. Examples of other suitable materials for the heat shrinkable layer include fluoropolymers (e.g., fluorinated ethylene propylene (FEP), Teflon or polytetrafluoroethylene (PTFE), Kynar polyvinylidene fluoride (PVDF)), polyvinyl chloride (PVC), neoprene, silicone elastomer, fluoroelastomer (e.g., Viton fluoroelastomer). Likewise, alternative embodiments include other suitable materials besides metalized PET films or PET film/foil laminates as the EMI shielding layer. For example, other exemplary embodiments of a heat shrinkable tape include metal foils and metalized fabrics that are cold bonded to heat shrinkable layers. In another example embodiment of an EMI shielding heat shrinkable tape, the EMI shielding layer comprises electrically conductive ink (e.g., a layer of silver ink) on a heat shrinkable layer (e.g., polyolefin, etc.). In still a further exemplary embodiment of an EMI shielding heat shrinkable tape, the EMI shielding layer may comprise metal that is coated or deposited via plasma vapor deposition directly onto the inside of a heat shrinkable layer (e.g., polyolefin, etc.).

In those exemplary embodiments that include an EMI shielding layer comprising polyethylene terephthalate (PET) film. The PET film may be laminated with or to a metal foil, or the PET film may be metalized via plasma vapor deposition (PVD), via electrolytically or chemically plating, electroless or electrolytic metal deposition using catalyst materials, etc. The inventors hereof have found that the use of PET film with metal (e.g., PET film/aluminum foil laminate, etc.) in such embodiments advantageously allows for cost reductions because PET film with metal is relatively low in cost. Also, the inventors have discovered that as a polyolefin layer shrinks in length the PET film (which does not shrink) will instead wrinkle as it gets shorter along with the polyolefin layer. By using a relatively thin, flexible PET film in such exemplary embodiments, the wrinkling of the PET film does not have any effect (or has an insignificant effect) on the metal or visual appearance of the outer layer of the tape.

In exemplary embodiments, an EMI shielding layer (e.g., metalized PET film, PET film/foil laminate, etc.) may be cold bonded to a heat shrinkable layer (e.g., polyolefin layer, etc.) at a temperature less than the shrink temperature (e.g., less than ninety degrees Celsius) of the heat shrinkable layer. This cold bonding process may include using a pressure sensitive adhesive or dispensed liquid adhesive, where the adhesive is based on an acrylic, rubber, or polyurethane. In an example embodiment, an EMI shielding layer comprising PET film may be cold bonded to a polyolefin heat shrinkable layer using a 5 mils thick 9485 acrylic adhesive transfer tape from the 3M Company, etc. Alternative embodiments may bond an EMI shielding layer to a heat shrinkable layer via other bonding processes or means, such as by using different adhesive tapes besides this particular tape from the 3M Company, by using thicker or thinner tapes (e.g., 2 mil thick, etc.), by using liquid adhesive systems, etc. For example, other exemplary embodiments may include bonding an EMI shielding layer to a heat shrinkable layer via a liquid adhesive system that is dispensed at a temperature (e.g., less than ninety degrees Celsius, etc.) sufficiently low enough that it does not cause the heat shrinkable layer to start shrinking.

In various exemplary embodiments, an EMI shielding heat shrinkable tape is formed from a heat shrinkable layer comprising cross-linked polyolefin material that is configured such that the tape shrinks or constricts lengthwise (e.g., a lengthwise shrink ratio of 2:1, 3:1, etc. along the X axis, etc.) when heated (e.g., heated to a predetermined minimum shrink temperature of about 90 degrees Celsius to 120 degrees Celsius, etc.). In such embodiments, the EMI shielding heat shrinkable tape preferably does not significantly shrink or constrict widthwise (e.g., along the Y axis) when heated. In some embodiments, the tape may shrink widthwise when heated but to a lesser degree than the tape's shrinkage or constriction in the lengthwise direction. Accordingly, the tape in such exemplary embodiments does not significantly narrow when heat shrunk lengthwise circumferentially around a cable (or other object) to which the tape is applied. Advantageously, this means that the heat shrinkage of the tape lengthwise will not cause excessive narrowing of the tape, which narrowing might otherwise leave gaps between the wraps of tape about the cable.

Figure 1:
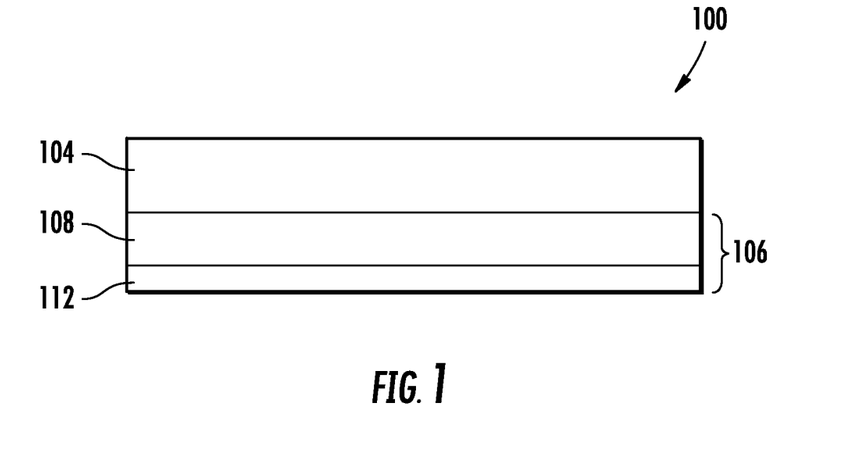
FIG. 1 illustrates an exemplary embodiment of an electromagnetic interference (EMI) shielding heat shrinkable tape comprising a heat shrinkable layer and an EMI shielding layer according to one or more aspects of the present disclosure.

Example embodiments will now be described with reference to the accompanying drawings. FIG. 1 illustrates an exemplary embodiment of an electromagnetic interference (EMI) shielding heat shrinkable tape 100 embodying one or more aspects of the present disclosure. As shown in FIG. 1, the tape 100 includes a heat shrinkable layer 104 and an EMI shielding layer 106 bonded to the heat shrinkable layer 104. Alternative embodiments may include a different number of layers than what is shown in FIG. 1. For example, other embodiments may include three or more individual layers bonded to one another.

In this example, the heat shrinkable layer 104 comprises a heat shrinkable cross-linked polyolefin material. The thicknesses of the heat shrinkable polyolefin layer 104 may be varied depending on the particular application. For example, the heat shrinkable polyolefin layer 104 may have a thickness of about 0.012 inches, 0.030 inches, 0.040 inches, etc. The dimensions given in this paragraph (as are all dimensions given herein) are provided for illustrative purposes only, as the particular dimensions may be varied and are not intended to limit the scope of the present disclosure.

The polyolefin forming the heat shrinkable layer 104 may be configured such that the tape 100 will only shrink lengthwise and not get narrower (e.g., not reduce in diameter when wrapped about a cable, etc.) when heated. This allows the tape 100 to shrink or constrict around a cable to which the tape 100 is applied without creating gaps between the wraps of tape 100. Alternative embodiments may include a heat shrinkable layer formed from other suitable materials besides polyolefin, such as fluoropolymers (e.g., fluorinated ethylene propylene (FEP), Teflon or polytetrafluoroethylene (PTFE), Kynar polyvinylidene fluoride (PVDF)), polyvinyl chloride (PVC), neoprene, silicone elastomer, fluoroelastomer (e.g., Viton fluoroelastomer).

With continued reference to FIG. 1, the tape 100 also includes the EMI shielding layer 106, which in this example is formed from a polyethylene terephthalate (PET) film 108 having electrically-conductive material 112 thereon. The electrically-conductive material 112 112 provides electrical conductivity and EMI shielding capability. The thicknesses of the PET film 108 may be varied depending on the particular application. For example, the PET film 108 may have a thickness of about 0.0002 centimeters, etc.

In this example, the electrically conductive material 112 on the PET film 108 comprises metal (e.g., copper, aluminum, and/or tin) provided (e.g., metalized, coated, vapor deposited, electrolytically or chemically plated, laminated, etc.) on the inner side of the PET film 108 such that the metal will be facing the cable or other component to be shielded. In one particular example, the EMI shielding layer 106 is a metalized PET film 108 on which metal (e.g., copper, aluminum, and/or tin, etc.) has been deposited via vapor deposition. In another example, the EMI shielding layer 106 is a film/foil laminate (e.g., PET film/aluminum foil laminate, etc.). Alternative embodiments may include different electrically-conductive materials (e.g., other metals, alloys, dielectric materials rendered electrically-conductive, etc.) and/or other processes for providing or rendering electrical conductivity and EMI shielding capability to a PET film 108 (or other material) of the EMI shielding layer 106, such as electrolytically or chemically plating, electroless or electrolytic metal deposition using catalyst materials, etc. Still other embodiments may include other suitable materials for the EMI shielding layer 106 besides a PET film/foil laminate or metalized PET film, such as metalized fabrics, metalized foils, electrically-conductive ink or plasma vapor deposited (PVD) metal applied directly onto the inside of the polyolefin layer, etc.

The heat shrinkable layer 104 and the EMI shielding layer 106 may be bonded together using a cold adhesive process during which the temperature preferably remains sufficiently low enough (e.g., less than ninety degrees Celsius) so that it does not cause the heat shrinkable layer 104 to start shrinking. This cold bonding process may include using a pressure sensitive adhesive or dispensed liquid adhesive, where the adhesive is based on an acrylic, rubber, or polyurethane. An example cold adhesive process uses an acrylic pressure sensitive adhesive transfer tape, such as a 5 mils thick 9485 acrylic adhesive transfer tape from the 3M Company, etc. In another example embodiment, the heat shrinkable layer 104 and EMI shielding layer 106 may be bonded or coupled to each other using other materials or processes, such as by coating metal directly onto the heat shrinkable layer 104 or by using a liquid adhesive system that is dispensed at a temperature (e.g., less than ninety degrees Celsius) sufficiently low enough that it does not cause the heat shrinkable layer 104 to start shrinking.

In some example embodiments, the electrically-conductive material 112 may be provided to or applied on (e.g., deposited, metalized, coated, plated, laminated, etc.) the PET film 108 (or other suitable material forming the EMI shielding layer) in one or more layers such that the one or more layers each have a desired (e.g., predetermined, etc.) thickness (e.g., a desired deposition weight, etc.). Moreover, the thickness of these electrically-conductive layers, coatings, depositions, laminates, etc. may be associated with desired (e.g., predetermined, etc.) electrical conductivities, surface resistivities, and/or volume resistivities. As such, the thicknesses of the electrically-conductive layers may be controlled/adjusted to thereby control/adjust electrical conductivity of the EMI shielding heat shrinkable tape 100. In an example embodiment, metal is plasma vapor deposited on a PET film such that the deposited metal has a surface resistivity of about 0.0009 ohms per square and/or having a thickness of 2 microns to 3 microns, etc. In another example embodiment, a PET film is laminated with a thin aluminum foil in which the aluminum foil layer has a thickness of about 9 to 25 microns thick and/or has a surface resistivity of less than 0.01 ohms per square.

Figure 2:
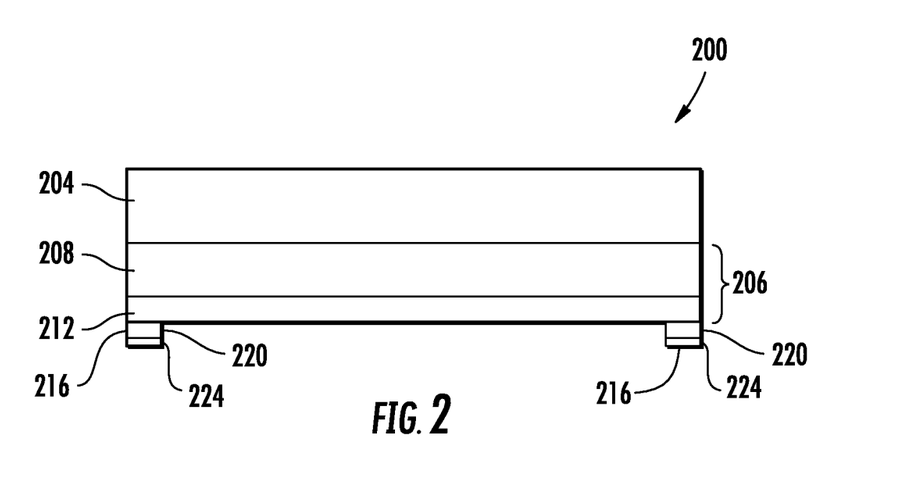
FIG. 2 illustrates another exemplary embodiment of an EMI shielding heat shrinkable tape comprising a heat shrinkable layer, an EMI shielding layer, and strips of pressure sensitive adhesive (PSA) with extended release liners along each side edge of the tape for holding the tape in position until heat shrinking, according to one or more aspects of the present disclosure.
Figure 3:
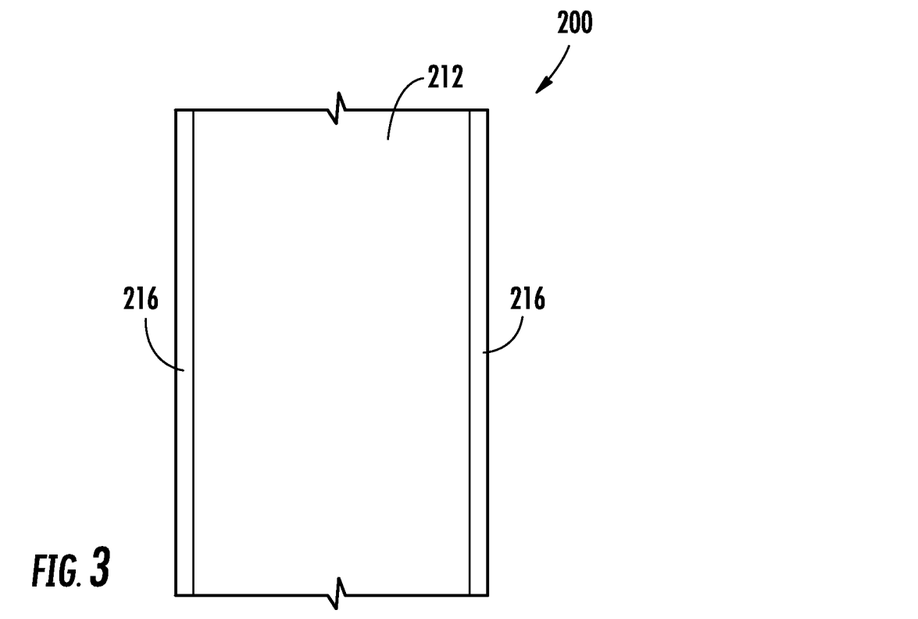
FIG. 3 is a bottom plan view of the EMI shielding heat shrinkable tape shown in FIG. 2 and illustrating the strips of PSA with extended release liners along each side edge of the tape.

FIGS. 2 and 3 illustrate another exemplary embodiment of an EMI shielding heat shrinkable tape 200 embodying one or more aspects of the present disclosure. As shown in FIG. 2, this example tape 200 includes a heat shrinkable layer 204 and an EMI shielding 206. The heat shrinkable layer 204 includes polyolefin, while the EMI shielding layer 206 includes a PET film 208 having metal 212 thereon providing electrical conductivity and EMI shielding capability. The metal 212 may comprise vapor deposited metal (e.g., copper, aluminum, tin, etc.), a laminated metal foil (e.g., aluminum foil, etc.), etc. The layers 204, 206 may be bonded to each other via a cold adhesion process, etc. In this example, the materials are provided as mere examples as other materials that may be used in other embodiments.

In addition to the heat shrinkable layer 204 and the EMI shielding layer 206, the tape 200 also includes means for holding the tape 200 in position (e.g., wrapped about a cable, etc.) until heat shrinking. In this example, the tape 200 includes strips 216 of pressure sensitive adhesive (PSA) 220 with extended release liners 224 along each side edge of the tape 200. As shown in FIG. 3, each strip 216 runs continuously from one end of the tape 200 to the other end of the tape 200. By way of example, each strip 216 may be ⅛ inch wide, although wider or narrower adhesive strips may also be used. Also by way of example, the extended release liners 224 may be paper release liners (e.g., 0.005 inch thick paper release liners, etc.) and/or polyester release liners (e.g., 0.002 inch thick polyester release liners, etc.), etc. In addition, alternative embodiments may include a plurality of spaced-apart strips or pads of PSA with extended release liners along either or both edges of the tape 200. Still further embodiments may include one or more strips or pads at locations (e.g., middle, etc.) spaced apart from the edges of the tape 200. Alternative embodiments may include other means for holding the tape 200 in position before heat shrinking.

Figure 4:
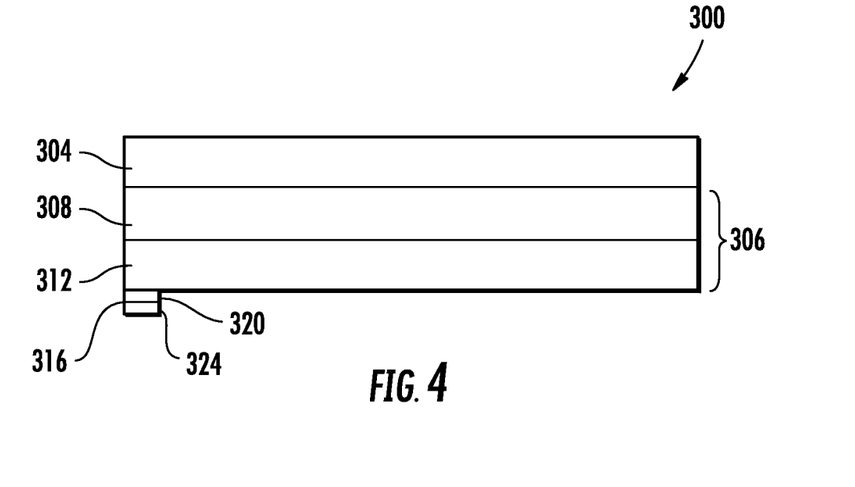
FIG. 4 illustrates another exemplary embodiment of an EMI shielding heat shrinkable tape comprising a heat shrinkable layer, an EMI shielding layer, and a strip of pressure sensitive adhesive (PSA) with an extended release liner along only one side edge of the tape for holding the tape in position until heat shrinking, according to one or more aspects of the present disclosure.
Figure 5:
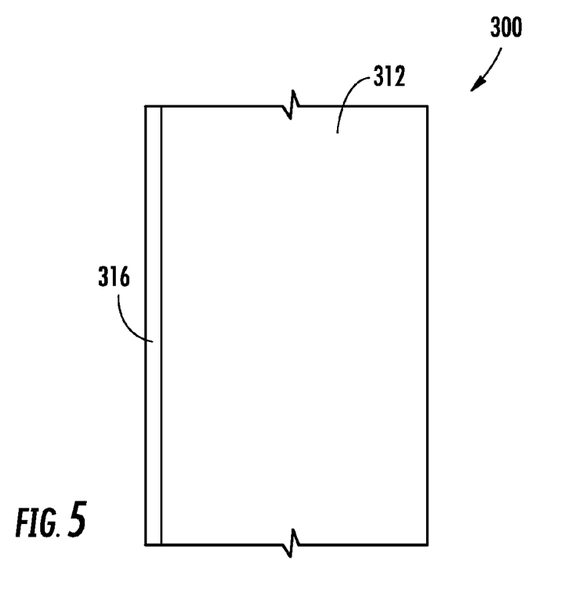
FIG. 5 is a bottom plan view of the EMI shielding heat shrinkable tape shown in FIG. 4.

FIGS. 4 and 5 illustrate another exemplary embodiment of an EMI shielding heat shrinkable tape 300 embodying one or more aspects of the present disclosure. As shown in FIG. 4, this example tape 300 includes a heat shrinkable layer 304 and an EMI shielding layer 306. The heat shrinkable layer 304 includes polyolefin, while the EMI shielding layer 306 includes a PET film 308 having metal 312 thereon providing electrical conductivity and EMI shielding capability. The metal 312 may comprise vapor deposited metal (e.g., copper, aluminum, tin, etc.), a laminated metal foil (e.g., aluminum foil, etc.), etc. The layers 204, 206 may be bonded to each other via a cold adhesion process, etc. In this example, the materials are provided as mere examples as other materials that may be used in other embodiments.

In addition to the heat shrinkable layer 304 and the EMI shielding layer 306, the tape 300 also includes means for holding the tape 300 in position (e.g., wrapped about a cable, etc.) until heat shrinking. In this example, the tape 300 includes a strip 316 of pressure sensitive adhesive (PSA) 320 with an extended release liner 324 along only one side edge of the tape 300. As shown in FIG. 5, the strip 316 runs continuously from one end of the tape 300 to the other end of the tape 300. By way of example, the strip 316 may be ⅛ inch wide, although a wider or narrower adhesive strip may also be used. Also by way of example, the extended release liner 324 may be a paper release liner (e.g., 0.005 inch thick paper release liner, etc.) and/or a polyester release liner (e.g., 0.002 inch thick polyester release liner, etc.), etc. In addition, alternative embodiments may include a plurality of spaced-apart strips or pads of PSA with extended release liners along either or both edges of the tape 300. Still further embodiments may include one or more strips or pads at locations (e.g., middle, etc.) spaced apart from the edges of the tape 300. Alternative embodiments may include other means for holding the tape 300 in position before heat shrinking.

Figure 6:
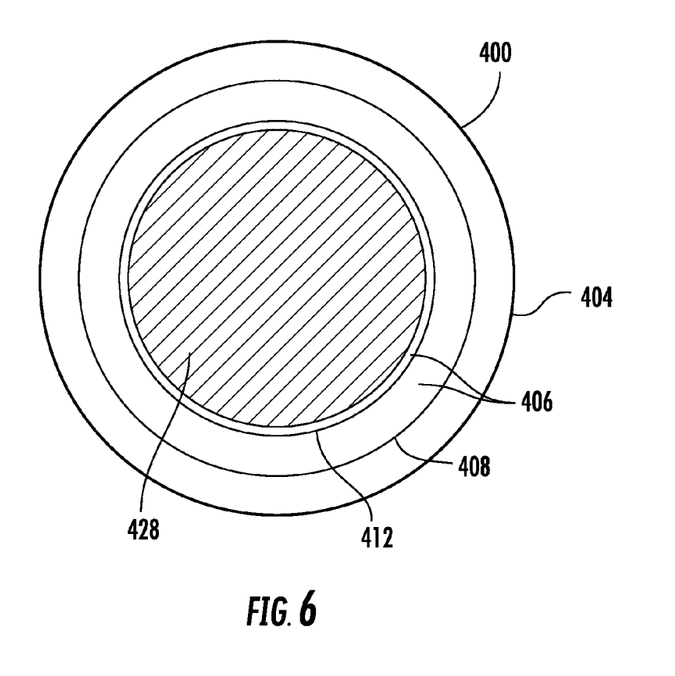
FIG. 6 illustrates an exemplary use of a EMI shielding heat shrinkable tape wrapped about a cable for providing EMI shielding according to one or more aspects of the present disclosure.

FIG. 6 illustrates an exemplary embodiment of an EMI shielding heat shrinkable tape 400 wrapped about a cable 428 to provide EMI shielding according to one or more aspects of the present disclosure. In this example, the tape 400 includes a heat shrinkable layer 404 and an EMI shielding layer 406. The heat shrinkable layer 404 includes polyolefin, while the EMI shielding layer 406 includes a PET film 408 having metal 412 thereon for providing electrical conductivity and EMI shielding capability. The metal 412 may be a relatively thin layer of vapor deposited metal (e.g., copper, aluminum, tin, etc.). Or, for example, the metal 412 may be a metal foil (e.g., aluminum foil, etc.) laminated to the PET film 408. The first and second layers 404, 406 may be bonded to each other via a cold adhesion process, etc. In this example, the materials are provided as mere examples as other materials that may be used in other embodiments.

As shown in FIG. 6, the tape 400 has been wrapped about the cable 428 such that the metal 412 (e.g., vapor deposited metal layer, laminated metal foil, etc.) is facing the cable 428. In addition, the tape 400 has also been heat shrunk in FIG. 6 such that the metal layer 412 is abutting against the outer portion of the cable 428. The cable 428 shown in FIG. 6 is but one example used for the EMI shielding heat shrinkable materials and articles disclosed herein, which may be used in a wide range of applications, installations, and electronic equipment.

Figure 7:
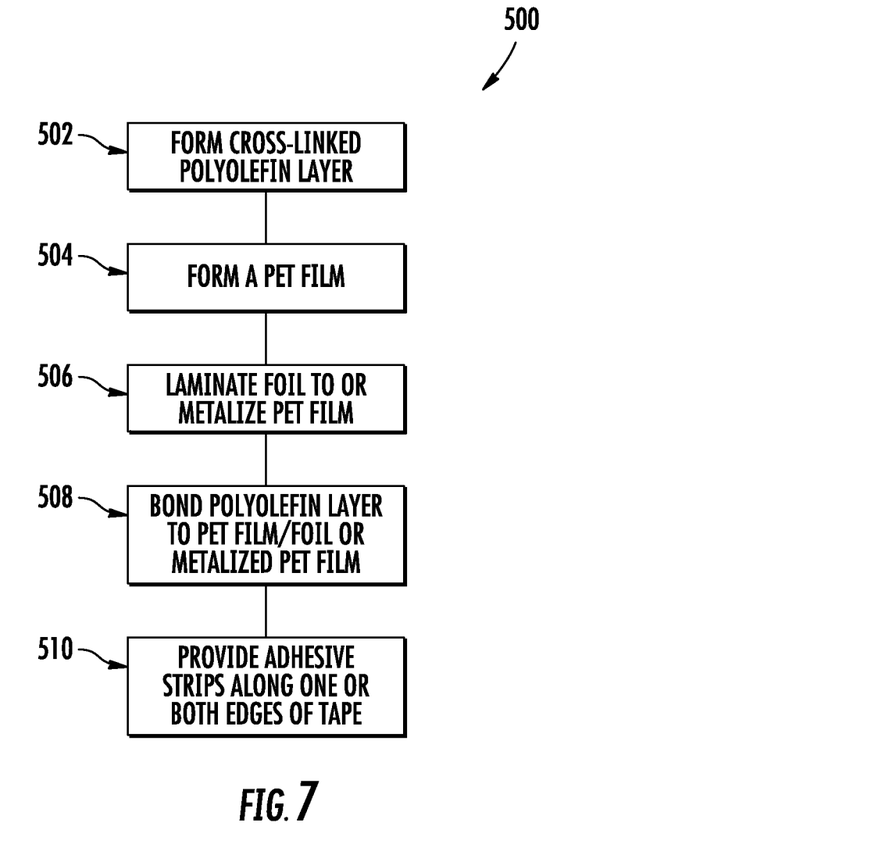
FIG. 7 is a flow chart illustrating various steps of an exemplary method for making an EMI shielding heat shrinkable tape according to one or more aspects of the present disclosure.

FIG. 7 illustrates an example method 500 for making an EMI shielding heat shrinkable material or article (e.g., tape 100 shown in FIG. 1, tape 200 shown in FIGS. 2 and 3, tape 300 shown in FIGS. 3 and 4, tape 400 shown in FIG. 6, etc.) including one or more aspects of the present disclosure. In this example embodiment, the EMI shielding heat shrinkable material or article formed in accordance with the method 500 is a tape that includes a heat shrinkable layer and an EMI shielding layer. But other articles and materials besides tapes may also be made in other embodiments implementing the method 500.

As shown in FIG. 7, the illustrated method 500 includes a process, operation, or step 502 of forming a cross-linked polyolefin heat shrinkable layer. In some embodiments, this step 502 instead comprises selecting a pre-existing cross-linked polyolefin layer. Alternative methods may include using other suitable materials besides polyolefin for the heat shrinkable layer, such as fluoropolymers (e.g., fluorinated ethylene propylene (FEP), Teflon or polytetrafluoroethylene (PTFE), Kynar polyvinylidene fluoride (PVDF)), polyvinyl chloride (PVC), neoprene, silicone elastomer, fluoroelastomer (e.g., Viton fluoroelastomer).

Process, operation, or step 504 includes forming a polyethylene terephthalate (PET) film. In some embodiments, this step 504 instead comprises selecting a pre-existing PET film. Alternative methods may include using other suitable materials besides PET, such as polypropylene film.

Process, operation, or step 506 includes laminating foil (e.g., aluminum foil, etc.) to the PET film or metalizing the PET film. For example, the metal may be applied via vapor deposition such that the PET film includes a relatively thin layer of vapor-deposited metal (e.g., aluminum, copper, tin, etc.) on the inner surface or side that will be facing the cable (or other object) to which the tape will be applied. Alternative methods may include using other suitable materials besides metal and/or other processes beside laminating and metalizing, such as electrolytic or chemical plating. Moreover, some embodiments may include selecting a pre-existing metalized PET film or PET film/foil laminate at steps 504 and 506.

Process, operation, or step 508 includes bonding the polyolefin layer to the metalized PET film via a cold adhesion process during which the temperature does not exceed the shrink temperature of the heat shrinkable polyolefin layer. This cold adhesion process may include using a pressure sensitive adhesive or dispensed liquid adhesive, where the adhesive is based on an acrylic, rubber, or polyurethane.

Process, operation, or step 510 includes providing one or more adhesive strips (e.g., strips 216 shown in FIGS. 2 and 3, strips 316 shown in FIGS. 3 and 4, etc.) along one or both side edges of the tape. The strips may comprise pressure sensitive adhesive (PSA) with extended release liners. In use, the strips may be used to hold the tape in position until heat shrinking. Alternative methods may include providing other suitable means (e.g., other adhesives, etc.) for holding the tape in position until heat shrinking. Still further embodiments may eliminate the step 510 when the tape to be made by the method 500 does not include any adhesive strips.

It is noted that any of the above-described operations of method 500 may be performed as a batch process, a continuous process, a combination thereof, etc. In addition, each of the operations can be performed in any suitable sequence and/or simultaneously as desired. Further, the method 500 may include fewer or additional operations to those described.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally," "about," and "substantially," may be used herein to mean within manufacturing tolerances. Or for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about," the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An electromagnetic interference (EMI) shielding heat shrinkable tape comprising a heat shrinkable layer and an EMI shielding layer, whereby the tape is configured to shrink lengthwise when heated to a shrink temperature of the heat shrinkable layer, wherein the EMI shielding layer comprises:
   a metalized PET film bonded to the heat shrinkable layer; or
   a PET film/foil laminate bonded to the heat shrinkable layer; or
   metal coated on the heat shrinkable layer; or
   electrically conductive ink on the heat shrinkable layer; or
   metalized fabric bonded to the heat shrinkable layer.

2. The tape of claim 1, wherein the heat shrinkable layer comprises heat shrinkable cross linked polyolefin material, such that the tape is configured to shrink lengthwise but not shrink widthwise when heated to a shrink temperature of the heat shrinkable layer whereby the tape will constrict around a cable about which the tape is applied.

3. The tape of claim 1, further comprising a pressure sensitive adhesive or dispensed liquid adhesive that bonds the heat shrinkable layer to the EMI shielding layer.

4. The tape of claim 1, wherein the heat shrinkable layer is bonded to the EMI shielding layer at a temperature below a shrink temperature of the heat shrinkable layer.

5. The tape of claim 1, further comprising an acrylic based adhesive, rubber based adhesive, or polyurethane based adhesive that bonds the heat shrinkable layer to the EMI shielding layer.

6. The tape of claim 1, further comprising one or more adhesive strips along one or both side edges of the tape, the one or more adhesive strips configured to help hold the tape in position relative to an object to be shielded by the tape at least until heat shrinking of the tape.

7. An electronic device including a cable and the EMI shielding heat shrinkable tape according to claim 1 wrapped about the cable.

8. An electromagnetic interference (EMI) shielding heat shrinkable tape comprising a heat shrinkable layer and an EMI shielding layer, whereby the tape is configured to shrink lengthwise when heated to a shrink temperature of the heat shrinkable layer, wherein:
   the heat shrinkable layer comprises polyolefin; and
   the EMI shielding layer comprises polyethylene terephthalate (PET) having electrically conductive material thereon.

9. The tape of claim 8, wherein the EMI shielding layer comprises:
   a metalized PET film bonded to the heat shrinkable layer; or
   a PET film/foil laminate bonded to the heat shrinkable layer.

10. An electromagnetic interference (EMI) shielding heat shrinkable tape comprising a heat shrinkable layer and an EMI shielding layer, whereby the tape is configured to shrink lengthwise when heated to a shrink temperature of the heat shrinkable layer, wherein the EMI shielding layer comprises a polyethylene terephthalate (PET) film and vapor deposited metal on the PET film.

11. A method for making an electromagnetic interference (EMI) shielding heat shrinkable tape that shrinks lengthwise but not widthwise when heated to a shrink temperature, the method comprising bonding or coating a heat shrinkable layer with an EMI shielding layer, wherein the EMI shielding layer comprises:
   a metalized polyethylene terephthalate (PET) film bonded to the heat shrinkable layer; or
   a PET film/foil laminate bonded to the heat shrinkable layer; or
   a PET film and vapor deposited metal on the PET film; or
   electrically conductive ink on the heat shrinkable layer; or
   metalized fabric bonded to the heat shrinkable layer.

12. The method of claim 11, wherein
   the heat shrinkable layer comprises heat shrinkable cross linked polyolefin material.

13. The method of claim 11, wherein:
   the heat shrinkable layer comprises heat shrinkable cross linked polyolefin material; and/or
   the EMI shielding layer comprises a polyethylene terephthalate (PET) film having electrically-conductive material thereon; and/or
   the method includes bonding the heat shrinkable layer to the EMI shielding layer at a temperature below a shrink temperature of polyolefin.

14. The method of claim 11, wherein bonding comprises:
   using a pressure sensitive adhesive or dispensed liquid adhesive to bond the heat shrinkable layer to the EMI shielding layer; and/or
   using an acrylic based adhesive, rubber based adhesive, or polyurethane based adhesive; and/or
   bonding the heat shrinkable layer to the EMI shielding layer at a temperature below ninety degrees Celsius.

15. The method of claim 11, wherein the heat shrinkable layer comprises heat shrinkable cross linked polyolefin material, such that the tape is configured to shrink lengthwise and reduce in length but not shrink widthwise and get narrower in width when heated to a shrink temperature of the heat shrinkable layer whereby the tape will constrict around a cable about which the tape is applied.

16. The method of claim 11, further comprising positioning one or more adhesive strips along one or both side edges of the tape, the one or more adhesive strips configured to help hold the tape in position relative to an object to be shielded by the tape at least until heat shrinking of the tape.

17. A method for providing electromagnetic interference (EMI) shielding to an object, the method comprising:
   wrapping an electromagnetic interference (EMI) shielding heat shrinkable article about the object such that an EMI shielding layer of the article is adjacent the object and a heat shrinkable layer of the article is positioned outwardly relative to the EMI shielding layer, the heat shrinkable article including polyolefin, the EMI shielding layer including a polyethylene terephthalate (PET) film having electrically-conductive material thereon; and
   heat shrinking the article.

18. The method of claim 17, wherein the article comprises an electromagnetic interference (EMI) shielding heat shrinkable tape, and wherein heat shrinking the article comprises heat shrinking the tape in the lengthwise direction so that the tape constricts around the object.

19. The method of claim 18, wherein:
   the heat shrinkable layer comprises heat shrinkable cross linked polyolefin material configured such that heat shrinking the tape only causes the tape to shrink lengthwise but not shrink widthwise when heated to a shrink temperature of the heat shrinkable layer; and/or
   the EMI shielding layer comprises polyethylene terephthalate (PET) having electrically conductive material thereon and bonded to the heat shrinkable layer.

20. The method of claim 18, wherein the method further comprising attaching the tape to the object before heat shrinking by using one or more adhesive strips along one or both side edges of the tape.

21. The method of claim 17, wherein the EMI shielding layer comprises:
   a metalized polyethylene terephthalate (PET) film bonded to the heat shrinkable layer; or a PET film/foil laminate bonded to the heat shrinkable layer; or a PET film and vapor deposited metal on the PET film.

* * * * *